(12) United States Patent
Elshafie

(10) Patent No.: US 11,069,691 B2
(45) Date of Patent: Jul. 20, 2021

(54) MEMORY CELL ARRAY WITH LARGE GATE WIDTHS

(71) Applicant: GLOBALFOUNDRIES U.S. Inc., Santa Clara, CA (US)

(72) Inventor: Shady Ahmed Abdelwahed Ahmed Elshafie, Dresden (DE)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 0 days.

(21) Appl. No.: 15/913,474

(22) Filed: Mar. 6, 2018

(65) Prior Publication Data

US 2019/0279991 A1 Sep. 12, 2019

(51) Int. Cl.

| H01L 27/11 | (2006.01) |
|---|---|
| H01L 27/02 | (2006.01) |
| H01L 29/10 | (2006.01) |
| H01L 27/12 | (2006.01) |
| H01L 29/08 | (2006.01) |
| H01L 29/417 | (2006.01) |
| H01L 21/84 | (2006.01) |
| H01L 21/306 | (2006.01) |
| H01L 21/02 | (2006.01) |
| H01L 21/3213 | (2006.01) |
| H01L 21/311 | (2006.01) |
| H01L 21/768 | (2006.01) |
| H01L 23/528 | (2006.01) |

(52) U.S. Cl.
CPC .... *H01L 27/1104* (2013.01); *H01L 21/02532* (2013.01); *H01L 21/02595* (2013.01); *H01L 21/30604* (2013.01); *H01L 21/31111* (2013.01); *H01L 21/32133* (2013.01); *H01L 21/76802* (2013.01); *H01L 21/76877* (2013.01); *H01L 21/845* (2013.01); *H01L 23/5283* (2013.01); *H01L 27/0207* (2013.01); *H01L 27/1203* (2013.01); *H01L 27/1211* (2013.01); *H01L 29/0847* (2013.01); *H01L 29/1033* (2013.01); *H01L 29/41783* (2013.01)

(58) Field of Classification Search
CPC .................................................. H01L 27/1104
USPC ......................................................... 257/348
See application file for complete search history.

(56) References Cited

U.S. PATENT DOCUMENTS

| 6,545,904 B2 | 4/2003 | Tran | |
|---|---|---|---|
| 2003/0102518 A1* | 6/2003 | Fried | H01L 21/84 257/401 |
| 2007/0264762 A1* | 11/2007 | Yeo | H01L 21/84 438/157 |
| 2009/0154215 A1* | 6/2009 | Parikh | G11C 5/063 365/63 |

(Continued)

*Primary Examiner* — Hsin Yi Hsieh
(74) *Attorney, Agent, or Firm* — Yee Tze Lim; Hoffman Warnick LLC

(57) ABSTRACT

An integrated circuit is provided with a memory cell array comprising poly lines, semiconductor lines extending in a first direction and transistor devices, wherein gates of the transistor device are formed in portions of the poly lines and channels of the transistor devices are formed in the semiconductor lines and wherein at least one portion of at least one of the poly lines runs across at least one of the semiconductor lines in a second direction inclined to a direction perpendicular to the first direction at an inclination angle of more than, for example, 5° or 10°, as measured from the direction perpendicular to first direction.

19 Claims, 4 Drawing Sheets

(56) References Cited

U.S. PATENT DOCUMENTS

2016/0064392 A1* 3/2016 Komiya ............ H01L 27/11519
                                                        257/316
2016/0358908 A1* 12/2016 Xie ...................... H01L 27/088

* cited by examiner

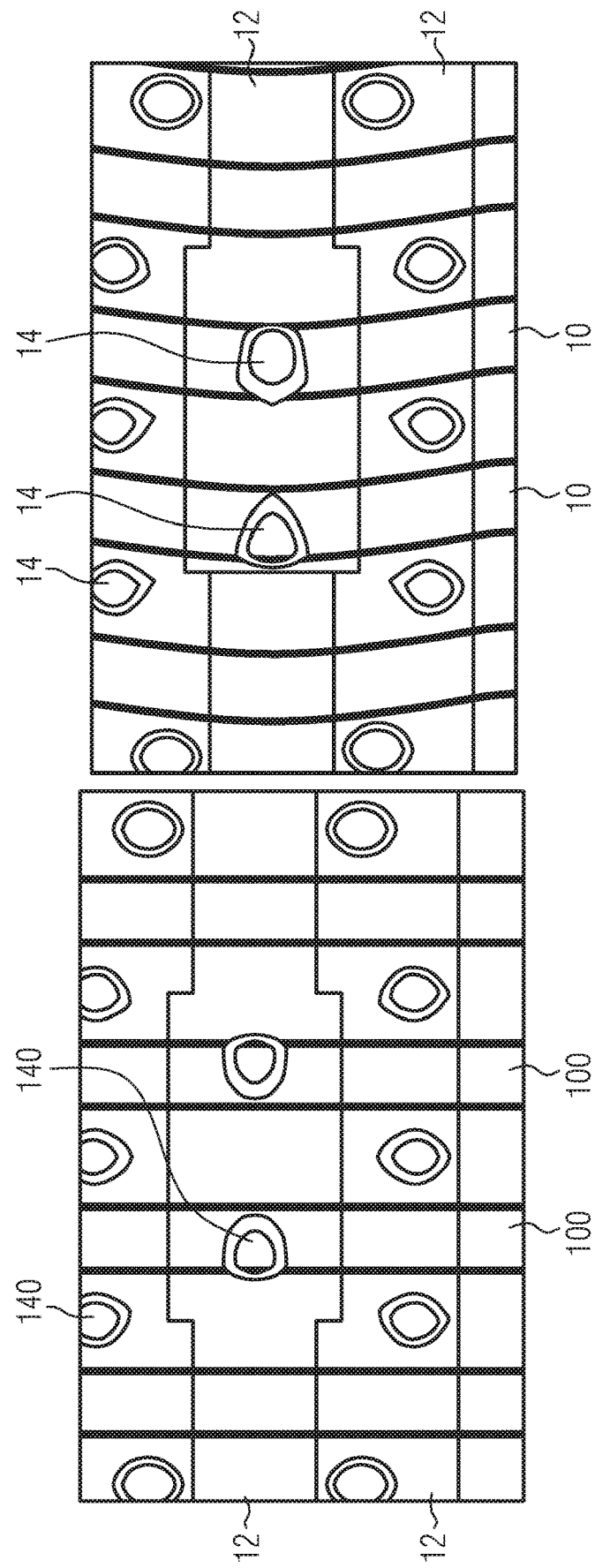

MEMORY CELL ARRAY WITH LARGE GATE WIDTHS

BACKGROUND

1. Field of the Disclosure

Generally, the present disclosure relates to the field of integrated circuits and semiconductor devices and, more particularly, to a memory cell array comprising a grid of poly lines and semiconductor lines comprising active semiconductor regions and the formation of such an array.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of electronic circuits, field effect transistors (FETs) represent one important type of circuit element that substantially determines the performance of integrated circuits. Generally, a plurality of process technologies are currently practiced for forming FETs, wherein, for many types of complex circuitry, metal-oxide-semiconductor technology is currently one of the most promising approaches due to the superior characteristics in view of operating speed and/or power consumption and/or cost efficiency. During the fabrication of complex integrated circuits using, for instance, CMOS technology, millions of N-channel transistors and P-channel transistors are formed on a substrate including a crystalline semiconductor layer.

Currently, many FETs are built on silicon-on-insulator (SOI), in particular fully depleted silicon-on-insulator (FD-SOI), substrates. The channels of the FETs are formed in thin semiconductor layers, typically including or made of silicon material, wherein the semiconductor layers are formed on insulating layer, buried insulation (BOX) layers that are formed on semiconductor bulk substrates.

For example, static random access memory (SRAM) integrated circuits (ICs) are widely used, both as stand-alone memories and as embedded memories in, for example, microprocessors. The storage capacity of such SRAM ICs has increased markedly so that memories in excess of one million bits are now common. As storage capacity increases, it is also increasingly more complex to design and process such chips. The increased storage capacity while needing to optimize the IC chip footprint requires a reduction in the size of individual components and in the minimum feature size, the minimum width of lines and spaces within an individual component. Processing complexity increases as the feature size decreases because it becomes difficult to precisely define lines and to ensure adequate spacing between features on different processing levels.

Presently known SRAM cells include six transistors and require at least three levels of metal in addition to the gate electrode level. Reliably processing the multiple layers of conductors and the necessary contacts to those conductor levels is difficult, especially when the minimum feature size shrinks to the range of 20 nanometers (nm) or less.

In integrated circuits, cell structures are formed by gate electrode lines (for example, polysilicon lines) defining standard cells of active semiconductor devices. Polysilicon (Poly) lines run parallel to each other. It is noted that the gates of the FETs may comprise a metal material in addition to the poly material. In advanced ICs, the gate constructs are so small that, with current technologies, they cannot be manufactured as arbitrarily placed gates. Instead, a regular grid of poly lines has to be manufactured consisting of parallel poly line shapes with exactly defined width and spacing. Afterwards, in additional manufacturing steps, unwanted poly lines will be removed using a poly line cut mask. The regular poly line grid ("sea of gates") is required to be surrounded by boundary cells that contain parallel poly line shapes of larger widths in order to protect the regular poly lines of the standard cells against polishing defects during manufacturing.

In order to reduce the time required to perform the design process, cell libraries have been created wherein standard cell designs are available. Of course, there are applications that may require one or more specialized cells, in which case the designer will either create a custom cell for the layout or alter a library cell in a manner required by the desired design. The resulting layout is used to manufacture the desired integrated circuit. Depending on the used design and library, back biasing can be done for the PMOS or NMOS devices or both.

In current memory cell designs, there is a need for increased transistor currents, in particular, increased read currents of read transistors reading charges of capacitors of the memory cells. In the art, widening of the diffusion regions (source and drains) has been proposed in order to increase the transistor currents. However, in the course of aggressive downscaling, for example, in the context of sub 22 nm Very Large Scale Integrated (VLSI) Circuits CMOS technologies, patterning challenges heavily restrict the spatial dimensions of the diffusion regions.

In view of the situation described above, the present disclosure provides a memory cell array comprising transistor devices allowing for relatively high transistor currents.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally the subject matter disclosed herein relates to the formation of memory cell arrays of ICs, in particular, SRAM memory cells comprising transistor devices, and, more particularly, IC SRAM cell structures with (MOS)FETs.

An integrated circuit is provided with a memory cell array comprising poly lines (in particular, extending in parallel to each other), semiconductor lines extending in a first direction (in particular, extending in parallel to each other) and transistor devices, wherein gates of the transistor devices are formed in portions of the poly lines and channels of the transistor devices are formed in the semiconductor lines. At least one portion of at least one of the poly lines runs across at least one of the semiconductor lines in a second direction inclined to a direction perpendicular to the first direction at an inclination angle of, for example, more than 5° or 10°, in particular, more than 15°, and more particularly, more than 20°, as measured from the direction perpendicular to the first direction.

Further, an SRAM device is provided comprising semiconductor lines extending in a first direction in parallel to each other and poly lines running across the semiconductor lines and in parallel to each other and transistor devices. At least one of the transistor devices comprises a channel region formed in one of the semiconductor lines and a gate formed in one of the poly lines and the gate extends in a width direction of the same with an inclination to a direction perpendicular to the first direction with an inclination angle of more than 5° or 10°, in particular, more than 15°, and more particularly, more than 20°, as measured from the direction perpendicular to the first direction.

Furthermore, a method of manufacturing an integrated circuit comprising a memory cell array, for example, the above-mentioned memory cell array is provided including the steps of providing an SOI substrate comprising a semiconductor substrate, a buried oxide layer formed on the semiconductor substrate and a semiconductor layer formed on the buried oxide layer, etching the semiconductor layer in order to form semiconductor lines running in a first direction, and forming a grid of poly lines and the semiconductor lines such that the poly lines run over and across the semiconductor lines and at least one portion of at least one of the poly lines runs across at least one of the semiconductor lines in a second direction inclined to a direction perpendicular to the first direction at an inclination angle of more than 5° (for example, in the range of 10° to 60°) or more than 10°, in particular, more than 15°, and more particularly, more than 20°, as measured from the direction perpendicular to the first direction.

In the above-described embodiments, the first and second directions lie in a plane of the longitudinal (lengths) and latitudinal (widths) extensions of the poly lines and the semiconductor lines.

BRIEF DESCRIPTION OF THE DRAWINGS

The disclosure may be understood by reference to the following description taken in conjunction with the accompanying drawings, in which like reference numerals identify like elements, and in which:

FIG. 4a shows a layout comprising contacts adapted to a memory cell array comprising inclined poly lines and semiconductor lines according to the art; and FIG. 4b shows a layout comprising contacts adapted to a memory cell array comprising inclined poly lines and semiconductor lines according to an example of the present disclosure.

Figure 1:
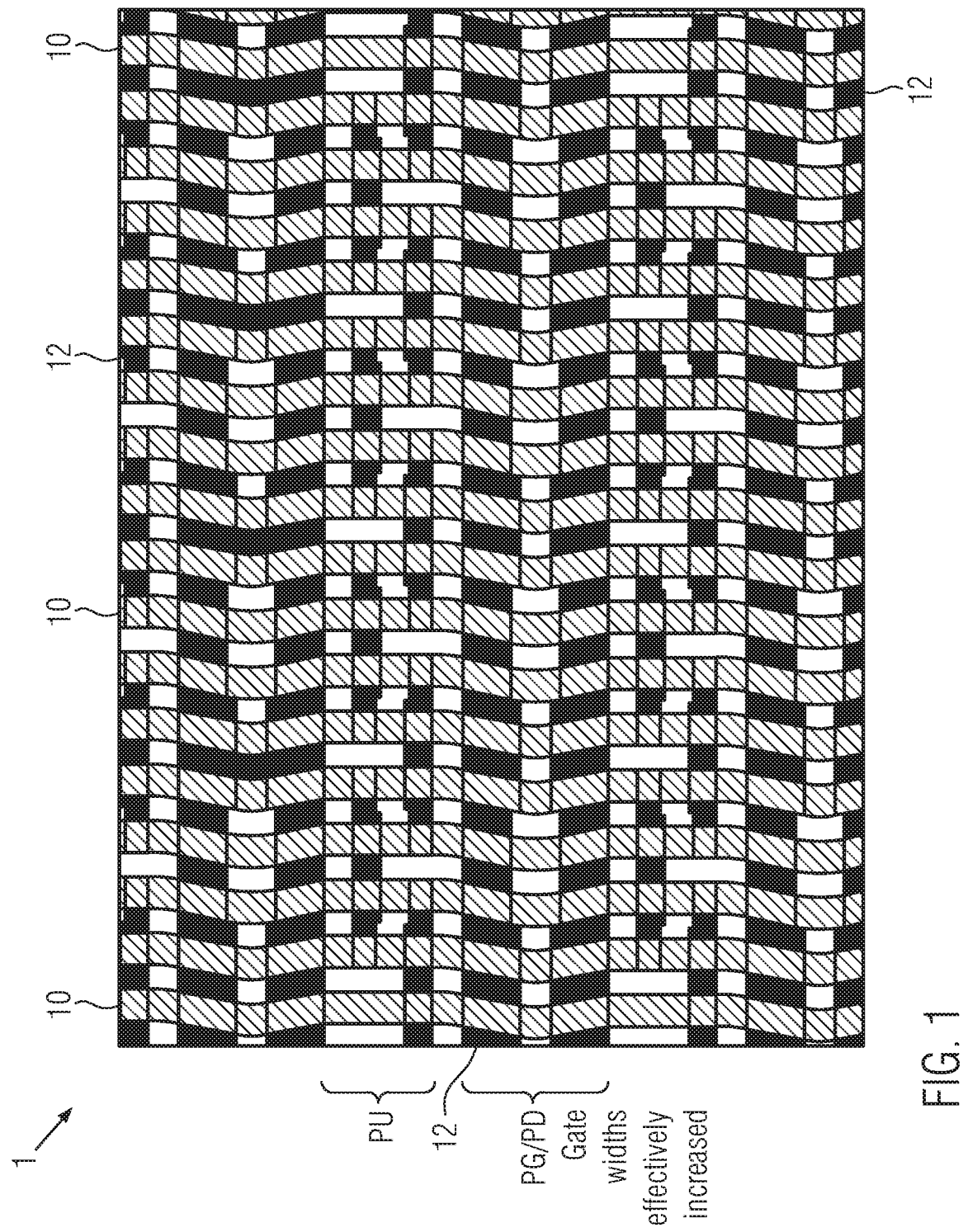
FIG. 1 illustrates a memory cell array comprising inclined poly lines and semiconductor lines in accordance with an example of the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the invention. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As will be readily apparent to those skilled in the art upon a complete reading of the present application, the present methods are applicable to a variety of technologies, for example, NMOS, PMOS, CMOS, etc., and is readily applicable to a variety of devices, including, but not limited to SRAM devices, particularly in the context of (Fully Depleted) Silicon-on-Insulator, (FD)SOI, technologies used for manufacturing ICs. The manufacturing techniques may be integrated in CMOS manufacturing processes. In particular, the process steps described herein are utilized in conjunction with any semiconductor device fabrication process that forms gate structures for integrated circuits, including both planar and non-planar integrated circuits. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor bulk substrate.

Herein, a semiconductor device is provided comprising memory cells defined by poly lines running across semiconductor lines including active regions wherein the poly lines are inclined with respect to the semiconductor lines. The poly lines provide transistor gates of transistor devices, particularly, read transistors, used to read charges stored in capacitors, and the semiconductor lines provide channel regions of the transistor devices. When viewed from above, the poly lines conventionally run perpendicular to the semiconductor lines. According to the present disclosure, the poly lines do not run perpendicular to the semiconductor lines, i.e., they are inclined with respect to the semiconductor lines.

FIG. 1 illustrates an example of the present disclosure. As shown in FIG. 1, poly lines 10 of a memory cell array 1, for example, an SRAM array, run across semiconductor lines 12. Gate electrodes of FETs, for example, MOSFETs, for controlling the (MOS)FETs are formed in/by the poly lines 10 and active regions (channel regions) of the FETs are formed in the semiconductor lines 12. Source/drain regions may be formed in and/or on the semiconductor lines. Different from the prior art, the poly lines 10 disclosed herein exhibit some serpentine shape such that active regions of FET devices are crossed not perpendicularly by the respective portions of the poly lines 10 but in an inclined manner, i.e., with an angle different from 90°. Thereby, the gate widths of the gates of the FETs can be significantly increased and, consequently, the (drive) transistor currents of the FETs of the memory cell array 1 can be increased as compared to the prior art. The gate "widths" refer to a direction across the semiconductor lines 12 which, in the conventional design, is perpendicular to the longitudinal axis of the semiconductor lines 12. The gate width of a FET is given by a portion of a poly line 10 overlapping a corresponding portion of a semiconductor line 12.

Here, and in the following examples, the disclosed layouts can be integrated in an IC design tool that may include a plurality of electronic software design tools that can be coupled to various databases, such as those of a semiconductor foundry and/or one or more customers of a foundry. Particularly, the IC design tool may include a plurality of device libraries which can be accessed through a graphical user interface, whereby cells from individual device libraries may be placed within an IC design layout.

Figure 2:
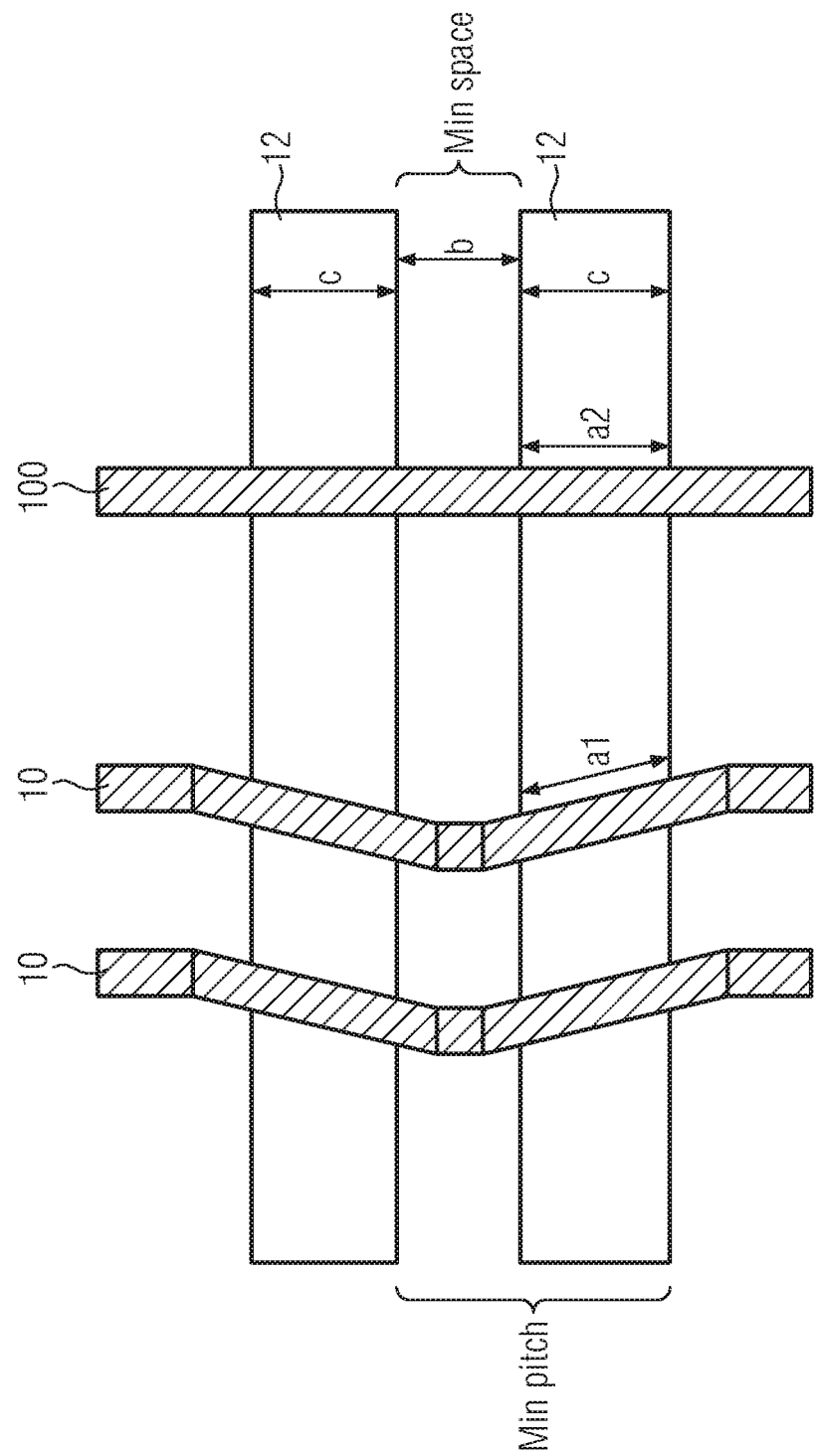
FIG. 2 shows a detailed view of the array shown in FIG. 1 in comparison to the conventional approach.

FIG. 2 shows a more detailed view of the array configuration 1 shown in FIG. 1 as compared to the conventional prior art approach. Two semiconductor lines 12 are shown that extend horizontally in FIG. 2. Two poly lines 10 arranged in accordance with the present disclosure are shown on the left-hand-side of FIG. 2. For a given minimum distance (space) b between the semiconductor lines 12 and a given width c of the semiconductor lines 12, according to the conventional approach shown on the right-hand-side of FIG. 2, wherein a semiconductor line 100 perpendicularly crosses the semiconductor lines 12, the gate width a2 is restricted to the width c of the semiconductor lines 12. Contrary, the poly lines 10 arranged according to the example of the present disclosure (and exhibiting the same poly line width as poly line 100) provide gate widths a1 larger than a2 for the same distance b between the semiconductor lines 12 and the same width c of the semiconductor lines 12. Accordingly, a higher transistor current is obtained.

Figure 3:
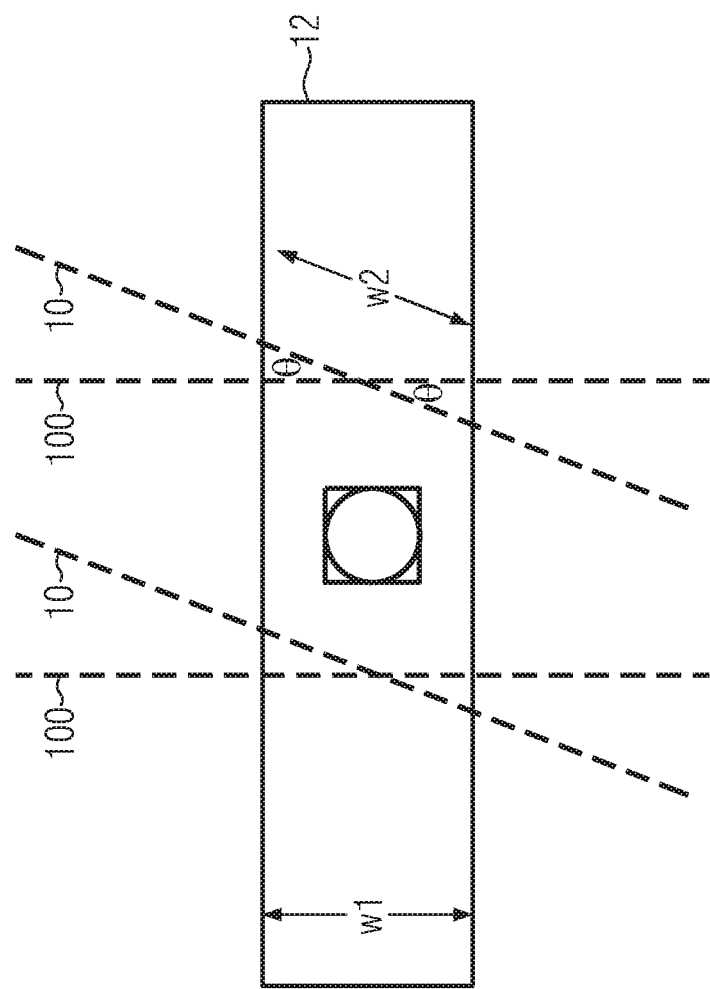
FIG. 3 illustrates the effect of increasing a gate width according to an example of the present disclosure.

FIG. 3 illustrates the effect of enlarging the gate width by inclining the poly lines 10 with respect to the semiconductor line 12 in more detail. As already stated above, by an "inclination" of the poly lines 10, it is meant that the poly lines 10 do not cross the semiconductor line 12 perpendicularly. FIG. 3 shows a portion of semiconductor line 12 that extends horizontally (longitudinal axis arranged in the horizontal direction; a latitudinal axis extends in the vertical direction in FIG. 3). The dashed lines that are orientated perpendicular to the longitudinal axis of the semiconductor line 12 indicate a poly line 100 arranged according to the prior art.

The dashed lines inclined with an inclination angle θ to the direction perpendicular to the longitudinal axis of the semiconductor line 12 (to an axis orientated along the width of the semiconductor line 12) indicate a poly line 10 that is arranged according to the present disclosure. Suitable inclination angles θ (positive/negative angles are measured clockwise/counterclockwise from the direction perpendicular to the longitudinal axis of the semiconductor line 12 towards the longitudinal axis of the semiconductor line 12) may lie in a range of 10° to 45°, in particular, 20° to 40°, and more particularly, 25° to 35° or 40°. The gate width according to the approach disclosed herein can be increased by a factor of $1/\cos(\theta)$ as compared to the conventional approach. As shown in FIG. 2, the poly lines 10 may comprise portions that are inclined at some positive inclination angle (measured clockwise) to the direction perpendicular to the longitudinal axis of the semiconductor line 12 (crossing the upper one of the poly lines 10 illustrated in FIG. 2) and portions that are inclined at some negative inclination angle (measured counterclockwise) to the direction perpendicular to the longitudinal axis of the semiconductor line 12 (crossing the lower one of the poly lines 10 illustrated in FIG. 2).

By increasing the gate width, the transistor current of a transistor of a memory cell array 1 as the one shown in FIG. 1, for example, a read transistor of an SRAM cell, can be increased. In some detail, a FET may be formed on an FD(SOI) substrate comprising a bulk substrate, a BOX layer formed on the bulk substrate and a semiconductor layer formed on the BOX layer. However, the herein disclosed approach is also suitable for other FETs, for example, bulk FETs. The semiconductor lines 12 can be formed of or may comprise portions of the semiconductor layer of the FD(SOI) substrate. Strained (SiGE) channel regions may be formed in the semiconductor lines 12 in order to increase the mobility of charge carriers in channels of P-channel FETs.

The bulk semiconductor substrate can be a silicon substrate, in particular, a single crystal silicon substrate. Other materials can be used to form the semiconductor substrate such as, for example, germanium, silicon germanium, gallium phosphate, gallium arsenide, etc. The semiconductor substrate comprises $N^+/P^+$ doped regions for back biasing. The BOX layer may include a dielectric material, such as silicon dioxide, and may have a thickness of at least 50 nm, for example. The semiconductor layer may provide the channel region of the FET and may be comprised of any appropriate semiconductor material, such as silicon, silicon/germanium, silicon/carbon, other II-VI or III-V semiconductor compounds and the like. The semiconductor layer may have a thickness suitable for forming a fully depleted field effect transistor, for example, a thickness in a range from about 5-8 nm.

The FET may comprise a gate electrode formed of or comprising a portion of one of the poly lines 10 shown in one of the FIGS. 1 to 3, for example. The gate electrode/poly lines may comprise metal gate and polysilicon gate materials. The material of the metal gate may depend on whether the transistor device to be formed is a P-channel transistor or an N-channel transistor. In embodiments wherein the transistor device is an N-channel transistor, the metal may include La, LaN or TiN. In embodiments wherein the transistor device is a P-channel transistor, the metal may include Al, AlN or TiN.

The metal gate may include a work function adjusting material, for example, TiN. In particular, the metal may comprise a work function adjusting material that comprises an appropriate transition metal nitride, for example, those from Groups IV-VI in the Periodic Table, including, for example, titanium nitride (TiN), tantalum nitride (TaN), titanium aluminum nitride (TiAlN), tantalum aluminum nitride (TaAlN), niobium nitride (NbN), vanadium nitride (VN), tungsten nitride (WN) and the like, with a thickness of about 1-60 nm. Moreover, the effective work function of the metal gate can be adjusted by added impurities, for example, Al, C or F. Atop of the metal gate, the poly gate may be formed.

The gate electrode may be separated from the semiconductor layer of the (FD)SOI substrate by a gate dielectric. The gate dielectric may comprise a high-k material layer with a dielectric constant k of above 4. The high-k material layer may comprise a transitional metal oxide, such as at least one of hafnium oxide, hafnium dioxide and hafnium silicon-oxynitride, and may be directly formed on the semiconductor layer of the (FD)SOI substrate.

Source and drain regions may be formed in and/or over the semiconductor layer of the (FD)SOI substrate. Raised source and drain regions may be formed, for example, by epitaxial growth.

It is noted that transistor devices of the memory cells shown in FIG. 1 may, in principle, be formed in fin-like semiconductor structures, commonly referred to as "FinFETs". With FinFETs, the semiconductor region containing the source/drain channel has a fin-like shape standing approximately perpendicular to the surface of the substrate die or wafer on which the device is formed. The gate electrodes can be provided on both exposed sides of the fin-like channel region and sometimes along the narrow top edge, although such edge gates are not required.

The transistor devices formed in the cells of the memory cell array 1 shown in FIG. 1 may be contacted by contacts formed through some dielectric layer, for example, an inter-layer dielectric (ILD), formed over the transistor devices. The contacts (and the corresponding contact holes formed in the dielectric layer) may be adapted to the particular design of the gates formed in the poly lines 10 illustrated in FIGS. 1 to 3.

FIG. 4b shows an exemplary layout according to the present disclosure in comparison to a conventional layout shown in FIG. 4a. In the conventional layout, poly lines 100 run perpendicularly across semiconductor lines 12. Contacts 140 are formed in a dielectric layer (not shown in FIG. 4a) for electrically contacting sources, drains and gates (also not shown in FIG. 4a), respectively, of transistor devices of a memory cell array of the art.

In FIG. 4b, a design in accordance with the present disclosure is shown. Poly lines 10 do not run perpendicularly across semiconductor lines 12 but rather with some finite inclination angle. Contacts 14 are formed in a dielectric layer (not shown in FIG. 4b) for electrically contacting sources, drains and gates, respectively, of transistor devices of a memory cell array, for example, the memory cell array 1 shown in FIG. 1. The design of the contacts 14 is optimized for the gates resulting from the serpentine shapes of the poly lines 10 as illustrated in FIG. 4b. In particular, the shapes of the contacts 14 and the corresponding contact holes formed in the dielectric layer can be adapted to the shapes of the gate regions. For example, raised source and drain regions of transistor devices can be contacted by means of combined trench silicide (TS) structures positioned on a gate electrode level and CA contact structures positioned in the dielectric layer formed in a level above the gate electrodes and contacting the TS structures.

As a result, the present disclosure provides semiconductor devices comprising memory cell arrays, in particular, SRAM devices, wherein poly lines and, thus, gate electrodes of transistor devices do not run perpendicularly across semiconductor lines providing channel regions of the transistor devices. Thereby, the gate widths of the transistor devices can be enlarged as compared to the art.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. An integrated circuit with a memory cell array, comprising:
   a plurality of conductive lines exhibiting a serpentine shape;
   a plurality of semiconductor lines extending in a first direction; and
   a plurality of transistor devices, wherein gates of said transistor devices are formed in portions of said conductive lines and channels of said transistor devices are formed in said semiconductor lines;
   wherein at least one portion of at least one of said conductive lines runs across a first one of said semiconductor lines in a second direction inclined to a direction perpendicular to said first direction at a first inclination angle of more than 5° as measured clockwise from said direction perpendicular to said first direction, and said at least one of said conductive lines run across a second one of said semiconductor lines in a third direction at a second inclination angle of more than 5° as measured counterclockwise from said direction perpendicular to said first direction,
   wherein said first inclination angle is between 10° and 40° as measured clockwise from said direction perpendicular to said first direction and said second inclination angle is between 10° and 40° as measured counterclockwise from said direction perpendicular to said first direction, and
   wherein a portion of said at least one of said conductive lines that overlaps a third one of said semiconductor lines is perpendicular to said first direction, wherein a width of said first one of said semiconductor lines in said direction perpendicular to said first direction is different from a width of said third one of said semiconductor lines in said direction perpendicular to said first direction.

2. The integrated circuit of claim 1, wherein said transistor devices are formed in and on a Fully Depleted Silicon-on-Insulator substrate and wherein said conductive lines comprise polysilicon.

3. The integrated circuit of claim 1, wherein said memory cell array is comprised in an SRAM device.

4. The integrated circuit of claim 1, further comprising:
a dielectric layer formed above said transistor devices; and
contacts formed in said dielectric layer and contacting sources, drains and said gates of said transistor devices;
wherein at least one of a position and a shape of said contacts are adapted to at least one of a width and a location of the gates formed in said conductive lines.

5. The integrated circuit of claim 4, wherein said transistor devices comprise raised source and drain regions formed above said semiconductor lines.

6. An SRAM device, comprising:
a plurality of semiconductor lines extending in a first direction in parallel to each other;
a plurality of poly lines running across said semiconductor lines and in parallel to each other, wherein said poly lines exhibit a serpentine shape; and
a plurality of transistor devices, wherein at least one of said transistor devices comprises a channel region formed in a first one of said semiconductor lines and a gate formed in a first portion of one of said poly lines, said gate extends across said channel region in a second direction with an inclination to a direction perpendicular to said first direction with a first inclination angle of more than 5° as measured clockwise from said direction perpendicular to said first direction, and a second portion of said one of said poly lines runs across a second one of said semiconductor lines in a third direction at a second inclination angle of more than 5° as measured counterclockwise from said direction perpendicular to said first direction,
wherein said first inclination angle is between 10° and 40° as measured clockwise from said direction perpendicular to said first direction and said second inclination angle is between 10° and 40° as measured counterclockwise from said direction perpendicular to said first direction, and
wherein a portion of said one of said poly lines that overlaps a third one of said semiconductor lines is perpendicular to said first direction, wherein a width of said first one of said semiconductor lines in said direction perpendicular to said first direction is different from a width of said third one of said semiconductor lines in said direction perpendicular to said first direction.

7. The SRAM device of claim 6, wherein said transistor devices are formed in and above a Fully Depleted Silicon-on-Insulator substrate consisting of a semiconductor substrate, a buried oxide layer formed on said semiconductor substrate and a semiconductor layer formed on said buried oxide layer and wherein said transistor devices comprise raised source and drain regions formed above said semiconductor layer.

8. The SRAM device of claim 7, wherein channel regions of said transistor devices are formed in said semiconductor layer.

9. The SRAM device of claim 8, further comprising:
an interlayer dielectric layer formed above said transistor devices; and
contacts formed in said interlayer dielectric and contacting sources, drains and/or gates of said transistor devices;
wherein at least one of a position and a shape of said contacts are adapted to at least one of a width and a location of the gates formed in said poly lines.

10. The SRAM device of claim 6, wherein said gate comprises metal layers and said gate is separated from said channel region by a high-k dielectric layer.

11. The SRAM device of claim 6, wherein said transistor devices are FinFETs.

12. A method of manufacturing an integrated circuit comprising a memory cell array, comprising the steps of:
providing an SOI substrate comprising a semiconductor substrate, a buried insulation layer formed on said semiconductor substrate and a semiconductor layer formed on said buried insulation layer;
etching said semiconductor layer in order to form semiconductor lines running in a first direction; and
forming a grid of conductive lines and said semiconductor lines, wherein said conductive lines exhibit a serpentine shape, said conductive lines run over and across said semiconductor lines, gates of transistor devices are formed in portions of said conductive lines and channels of said transistor devices are formed in said semiconductor lines, and at least a first portion of one of said conductive lines runs across a first one of said semiconductor lines in a second direction inclined to a direction perpendicular to said first direction at a first inclination angle of more than 5° as measured clockwise from said direction perpendicular to said first direction, and a second portion of said one of said conductive lines runs across a second one of said semiconductor lines in a third direction at a second inclination angle of more than 5° as measured counterclockwise from said direction perpendicular to said first direction,
wherein said first inclination angle is between 10° and 40° as measured clockwise from said direction perpendicular to said first direction and said second inclination angle is between 10° and 40° as measured counterclockwise from said direction perpendicular to said first direction, and
wherein a portion of said one of said conductive lines that overlaps a third one of said semiconductor lines is perpendicular to said first direction, wherein a width of said first one of said semiconductor lines in said direction perpendicular to said first direction is different from a width of said third one of said semiconductor lines in said direction perpendicular to said first direction.

13. The method of claim 12, wherein forming said conductive lines comprises forming a layer comprising polysilicon over said semiconductor layer and etching said layer comprising polysilicon to form said conductive lines.

14. The method of claim 12, further comprising:
forming a dielectric layer over said conductive lines;
etching said dielectric layer to form contact holes in said dielectric layer; and
filling said contact holes with a contact material;
wherein said contact holes are etched based on a layout design optimized for said at least the first portion of said one of said conductive lines that runs across said first one of said semiconductor lines that runs across said at least one of said semiconductor lines in said second direction inclined to said direction perpendicular to said first direction at said first inclination angle.

15. The method of claim 12, further comprising forming an SRAM device comprising said grid of said conductive lines and said semiconductor lines.

16. The integrated circuit of claim 5, wherein the transistor devices are read transistors.

17. The integrated circuit of claim 5, wherein the raised source and drain regions are contacted by combined trench silicide (TS) structures positioned on a gate electrode level and contact structures positioned in the dielectric layer formed in a level above the gate electrode level and contacting the TS structures.

18. The SRAM device of claim 6, wherein the transistor devices are read transistors.

19. The SRAM device of claim 7, wherein the raised source and drain regions are contacted by combined trench silicide (TS) structures positioned on a gate electrode level and contact structures positioned in the dielectric layer formed in a level above the gate electrode level and contacting the TS structures.

* * * * *